(12) United States Patent
Kim et al.

(10) Patent No.: US 9,236,341 B1
(45) Date of Patent: Jan. 12, 2016

(54) THROUGH-SILICON VIAS WITH METAL SYSTEM FILL

(75) Inventors: Dong W. Kim, San Jose, CA (US);
Myung-June Lee, Cupertino, CA (US);
Suresh Ramalingam, Fremont, CA (US)

(73) Assignee: XILINIX, INC., San Jose, CA (US)

( * ) Notice: Subject to any disclaimer, the term of this patent is extended or adjusted under 35 U.S.C. 154(b) by 1016 days.

(21) Appl. No.: 12/868,529

(22) Filed: Aug. 25, 2010

(51) Int. Cl.
*H01L 23/58* (2006.01)
*H01L 23/522* (2006.01)

(52) U.S. Cl.
CPC .................. *H01L 23/5226* (2013.01)

(58) Field of Classification Search
USPC ........................ 257/723, 678, 532; 438/620
See application file for complete search history.

(56) References Cited

U.S. PATENT DOCUMENTS

| | | | | |
|---|---|---|---|---|
| 6,020,633 A * | 2/2000 | Erickson | ....................... | 257/723 |
| 2005/0189636 A1* | 9/2005 | Savastiouk et al. | ........... | 257/678 |
| 2010/0164062 A1* | 7/2010 | Wang et al. | ................... | 257/532 |

OTHER PUBLICATIONS

"Studay of Ag—In solder as low temperature wafe bonding intermediate layer" SPIE vol. 6884, p. 68840H-1 2008 by Made et al.*
"Low Temperature Cu—Sn bonding by Isothermal Solodification Technology" IEEE 2009 ICEPT-HDP p. 96 by Rong et al.*
Kim, Jong S., "Fluxless Bonding of Silcon to AG-Copper Using In—Ag With Two UBM Designs," *IEEE Transaction on Components and Packaging Technologies*, Dec. 2008, pp. 776-781, vol. 31, No. 4, IEEE, Piscataway, New Jersey, USA.
So, William W. et al., "High Temperature Joints Manufactured at Low Temperature," *Proc. of the 1998 IEEE 48th Annual Electronic Components and Technology Conference*, May 25, 1998, pp. 284-291, IEEE, Piscataway, New Jersey, USA.

* cited by examiner

*Primary Examiner* — Howard Weiss
*Assistant Examiner* — Sue Tang
(74) *Attorney, Agent, or Firm* — Scot Hewett; LeRoy D. Maunu; Lois D. Cartier

(57) ABSTRACT

A silicon interposer includes a plurality of patterned metal layers formed on a silicon wafer portion and a plurality of through-silicon vias extending through the silicon wafer portion. The through-silicon vias have an interdiffusion conductive element.

15 Claims, 5 Drawing Sheets

THROUGH-SILICON VIAS WITH METAL SYSTEM FILL

FIELD OF THE INVENTION

An embodiment of the invention relates generally to integrated circuits, and more particularly to techniques for fabricating through-silicon vias with high melting point conductive elements.

BACKGROUND

For a given node technology, increasing integrated circuit (IC) size typically increases the functionality that can be included on a die. Unfortunately, defects often scale with die area. A large die is more likely to incorporate a defect than is a smaller die. Defects affect yield, and yield loss often increases with increasing die size. Various techniques have been developed to provide large ICs at desirable yield levels.

One approach to providing large ICs is to construct a large IC out of multiple smaller ICs (dice) on a silicon interposer, or to stack IC dice using through-silicon via (TSV) techniques. A silicon interposer is essentially a substrate to which the dice are flip-chip bonded after the silicon interposer has been processed to provide metal wiring and contacts. A silicon interposer typically has several patterned metal layers and intervening insulating layers connected to TSVs. Multiple IC dice are physically and electrically connected to the interposer with micro-bump arrays.

Stacked IC dice use TSV techniques to allow electrical connections to both sides of the parent die. For example, one side (e.g., front side) of a first die (the parent die) is bonded to a printed wiring board, package base, or other substrate, such as with a ball grid array, and the other side (the backside) has a micro-bump or other bonding technique that to which a second, frequently smaller, die is bonded. TSVs extend from the active portion of the first die to the backside of the die, and a microbump array or bonding pads are fabricated on the backside. TSVs are usually made conductive by sputtering a seed layer of metal and then using plating techniques to fill the TSVs with metal, such as copper. However, with sputtering or other conformal deposition techniques, voids can form that lead to incomplete metallization, particularly in conductive TSVs having a length:diameter ratio of 10:1 or greater. Plating process times can also be undesirably long.

Techniques for reliably filling TSVs with a conductive material with reduced manufacturing time are desirable, particularly high-aspect ratio TSVs.

SUMMARY

A composite IC includes an interposer having a silicon wafer portion and a plurality of interdiffusion conductive elements extending through the silicon wafer portion. The interdiffusion conductive elements have a re-melt temperature of at least 450 degrees Celsius. In a further embodiment, a first IC die and a second IC die are mounted on the interposer. In a particular embodiment, the interdiffusion conductive elements have an interdiffusion formation temperature less than 400 degrees Celsius. In some embodiments the interdiffusion conductive elements are essentially indium and silver, with indium being between 40 weight percent and 60 weight percent of the interdiffusion. In other embodiments the interdiffusion conductive elements are essentially tin and copper, with copper being at least 10 weight percent of the interdiffusion.

In a further embodiment, the interposer includes at least one patterned metal layer between the surface of the silicon wafer portion and the first IC die. The IC die can be a field-programmable gate array (FPGA) die, ASIC, or memory die, for example. The second IC die may also be a memory die, ASIC, or second FPGA die, for example.

In a particular embodiment, the first IC die is mechanically and electrically connected to the interposer with a conductive contact array having a melting temperature less than the re-melt temperature of the interdiffusion conductive elements. The conductive contact array can be, for example, a solder contact array having a melting temperature less than 300 degrees Celsius.

In some embodiments the interposer is an active interposer, and includes an electronic device fabricated in the silicon of the interposer.

In another embodiment, an interposer has a silicon wafer portion, a plurality of patterned metal layers disposed on the silicon wafer portion (e.g., a BEOL stack or interconnect stack), and a plurality of through-silicon vias extending through the silicon wafer portion, each through-silicon via having an interdiffusion conductive element. In some embodiments, the silicon wafer portion includes an electronic device formed in the silicon wafer portion.

In another embodiment, an interposer is fabricated by forming through-silicon holes in a silicon substrate. Dielectric liners are formed on sidewalls of the through-silicon holes, such as with a thermal silicon oxidation technique, and the through-silicon holes with at least one interdiffusion precursor. The interdiffusion precursor is heated to an interdiffusion temperature for a sufficient period to form interdiffusion conductive elements having a re-melt temperature of at least 450 degrees Celsius. In some embodiments the interdiffusion precursor is provided as a heated precursor having at least a liquid phase, which may optionally also have a solid phase or phases. Alternatively, the interdiffusion precursor can be provided as a mixture of one or more types of solid metal particles in a fluidizing carrier.

In yet another embodiment, a first metal (e.g., copper or silver) is deposited (e.g., sputtered or plated) on the sidewalls of the lined TSV holes, and a second metal (e.g., tin or indium) is injected in a molten or powered form to substantially fill the TSV holes. The first and second metals, which are provided in different states (phases), form the interdiffusion precursor. If the second metal is injected in a molten state, it is typically cooled below the melting point of the second metal to transform the second metal into a solid state. In a particular embodiment, a BEOL stack is fabricated on the interposer wafer with the TSV holes filled with interdiffusion precursor. In some embodiments, processing the BEOL stack provides sufficient temperatures for sufficient times to interdiffuse the precursor to form interdiffusion conductors in the TSVs. In other embodiments, an anneal process is performed, before, during, or after fabricating the BEOL stack, to transform the interdiffusion precursor into interdiffusion conductors in the TSVs.

DETAILED DESCRIPTION

Figure 1:
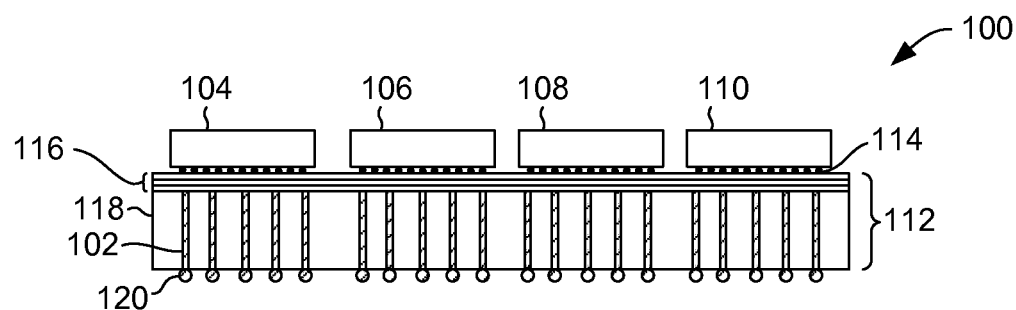
FIG. 1 is a cross section of a composite IC with TSVs in a silicon interposer according to an embodiment.

FIG. 1 is a cross section of a composite IC 100 with TSVs 102 according to an embodiment in an interposer 112. Four IC dice 104, 106, 108, 110 are mounted on the interposer 112. Alternative embodiments have more or fewer IC dice. The IC dice 104, 106, 108, 110 are flip-chip bonded to the interposer 112, making electrical connection to the interposer 112 through conductive microbump arrays 114. For example, the IC dice can be fabricated with a C4 or microbump array, which electrically and mechanically connects each IC die to corresponding micro-contact arrays on the interposer. Other types of contacts, contact arrays, and bonding techniques can be alternatively used. Other features and structures, such as optional underfill or molding compound, are omitted for purposes of illustration. In one embodiment, at least one of the IC dice is a field-programmable gate array (FPGA) die. In an alternative embodiment, at least one of the IC dice is an application-specific IC (ASIC) die or a memory die. In yet other embodiments, one or more dice are FPGA dice, and other dice are memory, processor, ASIC or other dice.

The interposer 112 has patterned metal layers 116 fabricated on a silicon wafer portion 118. In a particular example, the silicon wafer portion 118 is a portion of a silicon wafer similar to those used in IC fabrication. The patterned metal layers 116 may be formed using deposition and photolithographic techniques similar to those used for IC fabrication. For example, if an IC fabrication process flow (e.g., a 90 nm node technology) defines several patterned metal layers on an IC wafer (commonly called the back-end-of-line (BEOL) fabrication processes). Processes similar to those used to define the upper layers of the IC may be used to fabricate the patterned metal layers and intervening dielectric layers on the interposer wafer. Interposers typically have 1 to 4 patterned metal layers separated by intervening dielectric layers and interconnected using conductive vias, as is well known in the art of thin film, damascene, or dual damascene processing. These layers and interconnections form what is commonly known as a BEOL stack or interconnect stack.

An interposer according to some embodiments is a passive interposer. That means that the interposer does not have electronic devices, such as diodes, thin-film capacitors, and transistors, fabricated in the silicon of the interposer. Alternative embodiments incorporate active interposers, which have transistors or other devices fabricated in the silicon of the interposer. Such electronic devices are fabricated in what is commonly called front-end-of-line (FEOL) processing. In some embodiments, the active interposer incorporates a mid- to high-level of integrated circuitry. In other embodiments, relatively few electronic components are fabricated in the silicon of the interposer to handle functions such as voltage control, power distribution, and basic switching.

The interposer 112 translates the fine pitch of the IC contacts on the topside of the interposer to a less fine pitch on the backside. In particular examples, the topside of the interposer has about 20,000 to about 60,000 microbump contacts, and about 10,000 to about 30,000 TSVs, depending on the size of the composite IC, the number and type of ICs mounted on the interposer, and other factors. In a particular example, the microbumps are at a 45 micron pitch, and the TSVs are bumped 120 to form a bump array having a pitch of about 180 microns to about 200 microns. The conductive array 114 is made of solder bumps or balls that typically has a melting point less than 300° C., and in some embodiments about 212° C. The re-melt temperature of the interdiffusion conductive elements is significantly greater than the solder flow or re-flow temperature, and the interdiffusion conductive elements do not melt when solder bonding the IC dice to the interposer.

The conductive elements in the TSVs are made using metal systems, according to some embodiments. Generally, the interdiffusion conductive elements are formed at a relatively low temperature (e.g., about 200 degrees Celsius to about 300 degrees Celsius), and have a relatively high re-melt temperature (e.g., about 400 degrees Celsius to about 700 degrees Celsius). One or more phase transformations occur at the lower temperature (e.g., by solid-liquid interdiffusion) and result in a conductive phase with a higher melting point than the transformation temperature. For example, an indium-silver (In—Ag) metal system can be processed at 210° C. to result in a conductive TSV with a re-melt temperature of about 700° C. Similarly, a copper-tin (Cu—Sn) metal system can be processed at 280° C. to provide a conductive TSV with a similarly high melting point, or the ratio of copper to tin can be selected to result in a conductive TSV with a re-melt temperature of about 415° C. Other metals can be included in metal systems, according to some embodiments, both as minor constituents (e.g., not more than a few atomic or weight %, typically not resulting or contributing to another phase) or as a major constituents. For purposes of convenient discussion, metal systems according to embodiments that are processed at a lower temperature (interdiffusion formation temperature) to result in a conductive material, such as an alloy or intermetallic material, that has a higher re-melt temperature are referred to herein as interdiffusion metal systems.

Figure 2:
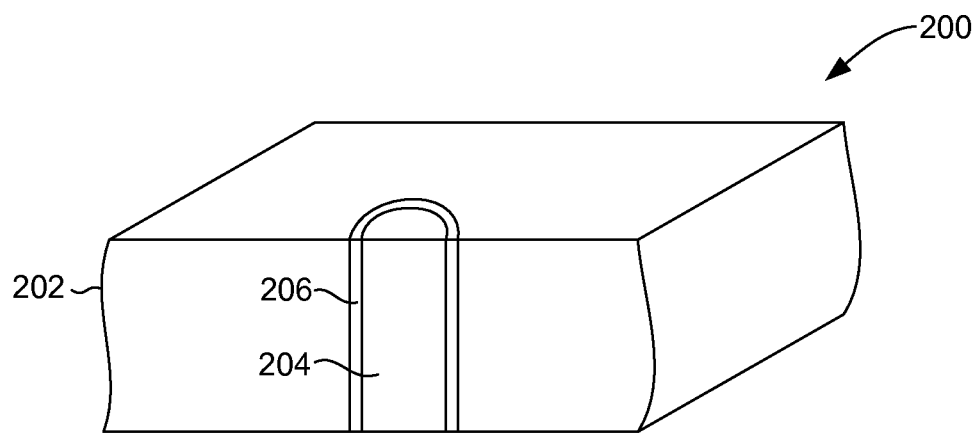
FIG. 2 is a partial cutaway isometric view of a TSV in a silicon interposer according to an embodiment.

FIG. 2 is a partial cutaway isometric view of a TSV in a partially fabricated silicon interposer 200 according to an embodiment. The silicon interposer 200 is fabricated from a silicon wafer 202. Typically, many interposers are fabricated from a wafer, the individual interposers being singulated from the wafer, as is well known in the art of silicon interposer fabrication. The silicon wafer is a single-crystal silicon wafer, or alternatively a wafer of poly-crystalline silicon, for example. The silicon wafer portion is often referred to as a substrate, particularly after an interposer has been singulated from the wafer.

The TSV includes an interdiffusion conductive element 204 of an interdiffusion metal system. The interdiffusion metal system includes one or more phases of conductive material, such as a metal or intermetallic. For example, one or more intermetallic phases could be dispersed in a metal matrix. The interdiffusion conductive element 204 is electrically isolated from the silicon body (substrate) 202 by a dielectric liner 206. A hole is formed in the silicon substrate, such as by using an isotropic etch technique, and the dielectric liner 206 is formed by heating the silicon substrate in an oxygen-containing atmosphere, which grows silicon dioxide on the walls of the TSV hole, or by depositing the dielectric liner layer. Alternatively, the dielectric liner layer is omitted.

The interdiffusion conductive element 204 has a re-melting point of at least 415° C. and an interdiffusion temperature less than 415° C. When an IC is mounted on (bonded to) the silicon interposer 200, a solder reflow technique is often used. Solder bumps or balls on the IC are melted or partially melted to electrically and mechanically bond to corresponding TSVs of the interposer. Such solder bonding is typically performed at temperatures of about 180° C. to about 225° C. TSVs using an interdiffusion metal system can be processed through such solder reflow processes without melting the interdiffusion conductive element 204 of the TSV. An interdiffusion metal system according to an embodiment is processed at a relatively low processing temperature, typically about 200° C. to about 300° C., to form conductive elements with high melting temperatures. Forming the interdiffusion conductive element at a low processing temperature is important, because it provides a low thermal overhead for the process wafer, and a low maximum processing temperature.

Alternative techniques use a metal (solder) with a relatively high melting point that is applied in a molten state to fill the TSV holes. This approach requires a high-temperature injection head or similar tooling, and subjects the process wafer to relatively high temperature gradients, which can cause warpage and other yield losses. Another approach uses a solder paste of a relatively high-melting point solder to fill the TSV holes, which is then heated to a temperature sufficient to melt the solder. While this technique is attractive for some applications, it exposes the process wafer to relatively high temperatures, and is generally incompatible with active interposers, because the high temperatures used to melt the high-temperature solder are incompatible with the BEOL processing of both active and passive interposers.

Figure 3:
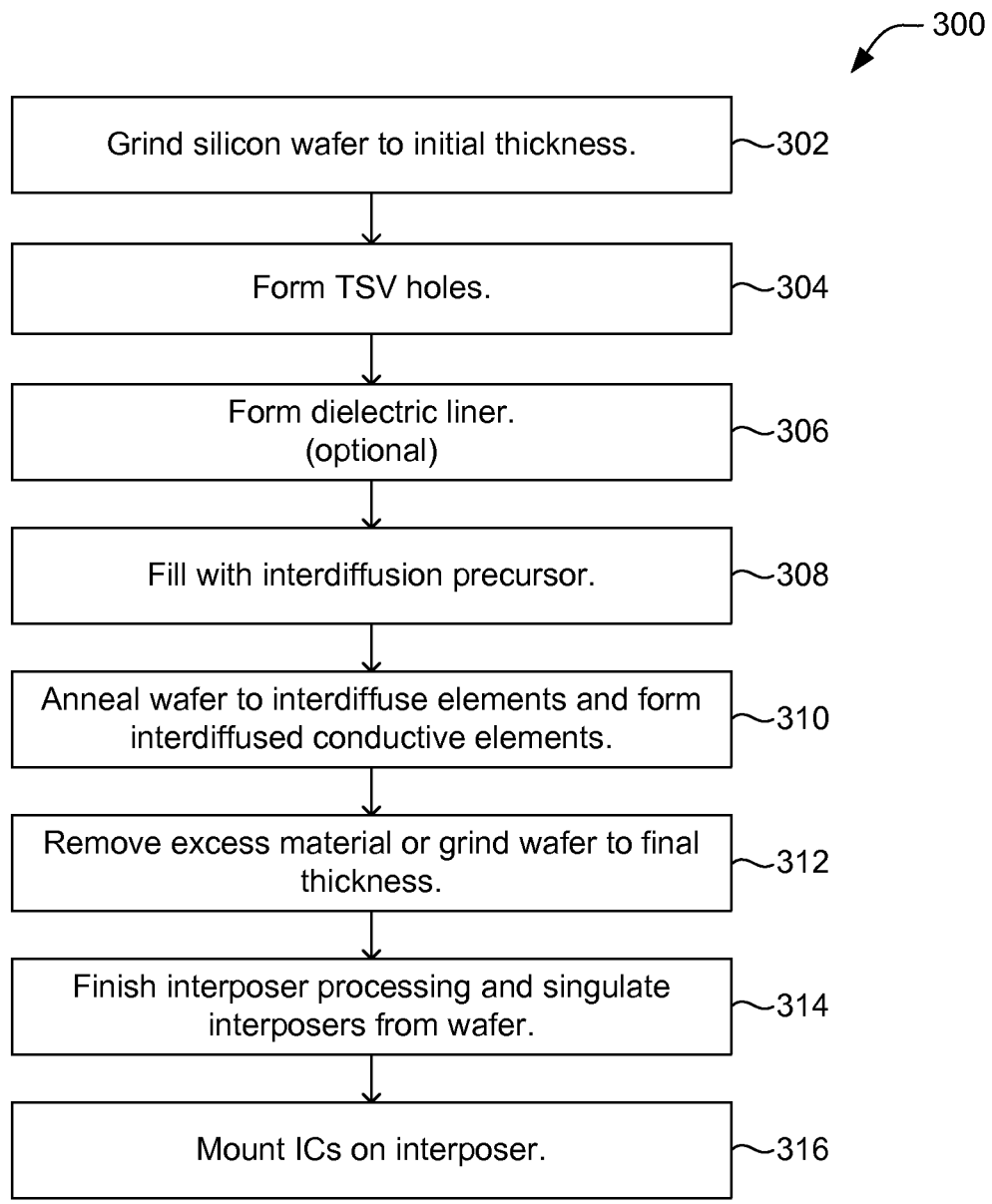
FIG. 3 is a flow chart of a method of forming TSVs using a deformable interdiffusion precursor according to an embodiment.

FIG. 3 is a flow chart of a method 300 of forming TSVs using a deformable interdiffusion precursor according to an embodiment. A silicon wafer is ground to a first desired thickness suitable for forming TSV through holes (step 302). The silicon wafer can be, for example, a 300 mm diameter wafer approximately 775 microns thick that is ground to a thickness of about 250 microns to about 100 microns. In an exemplary TSV hole-forming process, such as the BOSCH™ process, the minimum diameter of the through holes is about $1/10^{th}$ the wafer thickness. For example, 10 micron holes are formed in a wafer 200 microns thick, or 25 micron holes are formed in a wafer 500 microns thick. The hole dimension is typically selected according to the desired pitch (spacing) of the TSVs. Generally, TSVs that are more closely spaced (and hence thinner wafers) are used with denser contact arrays.

TSV through holes are formed (step 304), such as by using a capacitively coupled plasma etch technique that etches the silicon in an anisotropic manner. A dielectric liner is formed (step 306), such as by growing silicon dioxide on the walls of the TSV through holes. Optionally, a dielectric liner is not formed on some TSV through holes. The TSV holes are filled or partially filled with interdiffusion precursor (step 308). In one embodiment, a heated injection head dispenses a mixture of metals, such as a mixture of indium and silver or copper and tin, into one or more TSV holes. The mixture is heated to a temperature sufficient to produce a liquid phase (e.g., 210° C. for liquid indium-silver or 280° C. for liquid copper-tin), which is typically in combination with one or more solid phases (e.g., $AgIn_2$ or $Cu_6Sn_5$). The result is a pasty, multi-phase (e.g., solid plus liquid) compound that can be injected or molded into the TSV holes. When the heat is removed and the compound is allowed to cool to room temperature, it solidifies. If the compound is then annealed (i.e., held at an annealing temperature for a period of time), the components of the metal system form an interdiffused conductor.

In a particular embodiment, molten silver and molten indium are independently injected into a TSV hole, where they mix and form $AgIn_2$+Ag+In. The mixture is annealed (e.g., at 400 degrees Celsius for three hours) to form $Ag_2In$+ zeta phase. The melting temperature of the interdiffused conductor is over 600 degrees Celsius. The interdiffused conductor of the TSV withstands typical BEOL processing temperatures and thermal budgets without melting, as a conventional low-temperature solder conductor would.

In an alternative embodiment (see generally, FIGS. 5A-5D), an interposer wafer is processed to include FEOL devices (e.g., for active interposers) or is otherwise limited in thermal budget or maximum temperature. A thin layer of silver or copper is formed in the TSV holes, similar to the seed layer formed for conventional TSVs. However, in a conventional TSV, layer continuity and uniformity are important for the subsequent plating process. When forming interdiffused conductors, continuity and uniformity in the sputtered or plated metal layer are not essential, as long as a sufficient amount of metal is formed in the TSV hole (i.e., within the stoichiometric reaction and composition limits of the desired interdiffusion). Thus, for a given TSV diameter, deeper TSVs may be formed. Deeper TSVs are desirable because a thicker, and hence stronger, interposer substrate may be obtained. Indium or tin is injected into the TSV holes, typically in a molten state, and cooled, which solidifies the metal. However, at this point the indium or tin still has a relatively low melting point (i.e., roughly the melting point of the metal). The interposer wafer is processed to form the BEOL stack. In one embodiment, the thermal product of forming multiple dielectric and patterned metal layers in the BEOL stack provide are sufficient so that the metals in the TSVs interdiffuse to form interdiffusion conductors having a relatively high melting point (e.g., significantly higher than the melting point of solder typically used in packaging processes).

In an alternative embodiment, a mixture of solids, optionally in a fluidizing carrier such as a flux or polyvinyl alcohol, and in correct proportion to provide an interdiffusion contact, is injected or molded into the TSV through holes. In a particular embodiment, a screen-printing type of technique is used to "squeegee" the interdiffusion precursor into the TSV through holes. For example, a mixture of fine Ag powder and fine In powder in a ratio of about 60:40 wt % Ag:In to about 40:60 wt % Ag:In can be used as the interdiffusion precursor. Generally, a fine mesh powder is desirable to initiate the eutectic melting and the subsequent interdiffusion processes, and to uniformly fill the TSV holes. For TSVs having a diameter of about 10 microns, it is desirable to have metal powders having a mean particle size of not greater than about one micron. In some embodiments, the silicon substrate is heated to facilitate interdiffusion.

In yet another embodiment, copper is sputtered on the sidewalls of the TSVs (generally on the dielectric liner), and the TSVs are filled with tin metal powder or molten tin. It is desirable that the sputtered copper be at least about 10 weight % of the tin. Unlike conventional plated TSVs, which can be greatly affected by the uniformity of the sputtered copper layer due to its importance for the subsequent plating step, gaps or other non-uniformities in a sputtered copper layer form forming an interdiffused conductor in a TSV are less critical, because the copper will be generally used up (essentially dissolved) in the interdiffusion process. Conductive TSVs having a length:diameter ratio of greater than 10:1, and in some cases as much as 20:1, are formed having interdiffused conductors.

The TSV wafer is annealed to interdiffuse the elements of the interdiffusion precursor in the TSV (step 310). In an exemplary embodiment, an indium-silver interdiffusion precursor applied as a heated liquid-solid paste is held at an interdiffusion formation temperature (anneal temperature) of 400° C. for about three to about five hours to form interdiffused TSVs having a re-melting temperature of at least 700° C. In an alternative embodiment, a copper-tin interdiffusion precursor applied as either a sputtered copper layer combined with a molten tin injection, or a power mixture of copper and tin, is annealed at 280° C. for about three to about five hours to form interdiffused TSVs having a re-melting temperature of at least 700° C. The high re-melt temperature of the interdiffused TSVs avoids melting of the TSV conductors during back-end processing of the interposer wafer, which basically includes depositing dielectric layers between patterned metal layers, using processes that typically reach 450° C., or during the die-attach solder re-flow processing, which occurs generally at temperatures between about 200° C. and about 280° C.

The interposer wafer is cleaned, if necessary (step 312), to remove excess interdiffusion precursor or interdiffused conductor material, and then processed (step 314) to form interposers. In a particular embodiment, post interdiffusion cleaning is done by backlapping or otherwise removing a small amount of substrate material, which can re-planarize the wafer. The continued processing includes backend layer formation and bumping of the opposing (e.g., bottom) side of the TSVs. In a further embodiment, one or more ICs, such as an FPGA or multiple FPGAs, are mounted (bonded) on the interposer to form a composite IC (step 316).

Figure 4A:
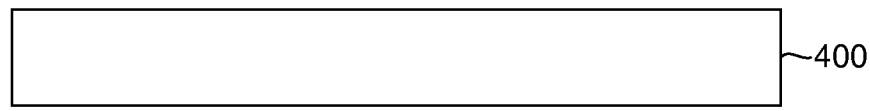
FIG. 4A is a cross section of a portion of a silicon wafer for use in an embodiment.

FIG. 4A is a cross section of a portion of a silicon wafer 400 for use in an embodiment.

Figure 4B:
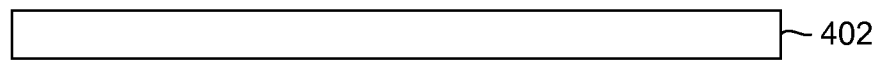
FIG. 4B is a cross section of the portion of the silicon wafer of FIG. 4A after thinning.

FIG. 4B is a cross section of the portion of the silicon wafer of FIG. 4A after thinning. The thinned wafer 402 is ground or lapped to a thickness suitable for forming TSV holes. Generally, the minimum diameter and spacing of TSV holes depends on the thickness of the wafer. For example, the diameter of the TSV hole is $1/10^{th}$ the wafer thickness, so smaller holes may be formed in thinner wafers. However, thinner wafers are also more prone to breakage. In some embodiments, the silicon wafer is ground to the final thickness or essentially the final thickness before TSV processing. Alternatively, the wafer is ground to an intermediate thickness that is suitable for forming the desired TSVs and sufficiently thick to allow processing without undue yield losses to breakage. The wafer is ground or lapped after TSV processing to the final wafer thickness, or alternatively, is not thinned further.

Figure 4C:
FIG. 4C is a cross section of the portion of the silicon wafer of FIG. 4B after via formation.

FIG. 4C is a cross section of the portion of the silicon wafer of FIG. 4B after via formation. The vias 404 are holes formed through the thinned silicon wafer 402. The vias 404 are formed using an anisotropic plasma etch process, for example.

Figure 4D:
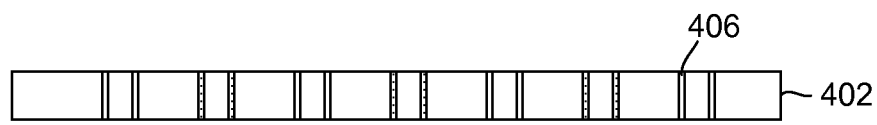
FIG. 4D is a cross section of the portion of the silicon wafer of FIG. 4C after via lining.

FIG. 4D is a cross section of the portion of the silicon wafer of FIG. 4C after via lining. A liner layer 406 is formed on the inner surfaces of the vias. In a particular embodiment, the liner layer 406 is a layer of silicon dioxide grown from the silicon of the thinned silicon wafer 402 or deposited, such as with a vapor deposition technique. The liner layer 406 provides electrical isolation between the conductive element of the TSV and the substrate, and in an exemplary embodiment is about 0.5 microns to about 2.5 microns thick.

Figure 4E:
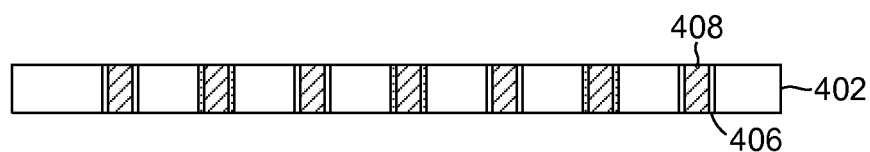
FIG. 4E is a cross section of the portion of the silicon wafer of FIG. 4D with conductive vias using a metal system according to an embodiment.

FIG. 4E is a cross section of the portion of the silicon wafer of FIG. 4D with conductive vias using a metal system according to an embodiment. Interdiffused conductive elements 408 are formed by injecting metal system fluid or paste (either heated multi-phase paste or solid particles in a fluidizing carrier) into in the lined vias, and then annealing the wafer to form an interdiffused conductive element 408 having a melting point (re-melt temperature) above 400° C. In a particular embodiment, the conductive element has a re-melt temperature above 450° C., which is compatible with the maximum temperature of a typical BEOL fabrication sequence.

Figure 5A:
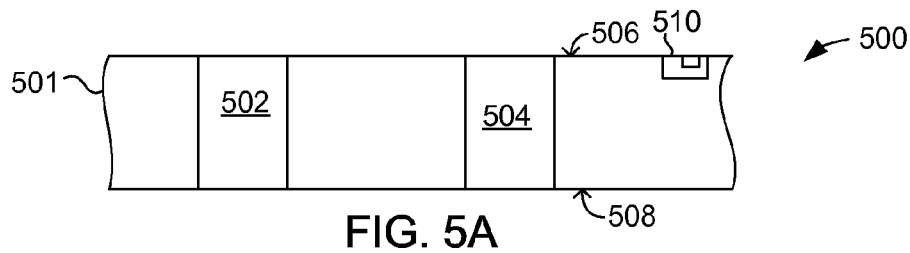
FIG. 5A is a cross section of a partially fabricated active silicon interposer.

FIG. 5A is a cross section of a partially fabricated silicon interposer 500 with TSV holes 502, 504 formed from a first surface 506 of a substrate 501 to a second surface 508 of the substrate 501. An electronic device 510, such as a transistor, has been formed at the first surface 506 of the substrate. In a particular embodiment, the electronic device 510 is formed using FEOL techniques before the TSV holes are formed (etched).

Figure 5B:
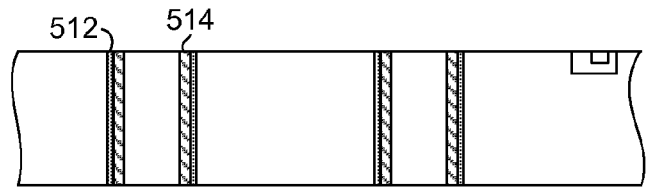
FIG. 5B is a cross section of the partially fabricated interposer of FIG. 5A after an isolation layer and a first metal layer are formed in the TSV holes.

FIG. 5B is a cross section of the partially fabricated interposer of FIG. 5A after an isolation layer 512 and a metal layer 514 are formed. In a particular embodiment, the isolation layer is a layer of silicon dioxide. The metal layer is a layer of a first selected metal that will interdiffuse with one or more other metals to form an interdiffused conductor. In one embodiment, the first selected metal is silver that is sputtered or plated inside the lined TSV holes. In another embodiment, the first selected metal is copper that is sputtered or plated inside the lined TSV holes. Alternative embodiments use other first selected metal or other techniques for providing the metal in the TSVs for subsequent interdiffusion.

Figure 5C:
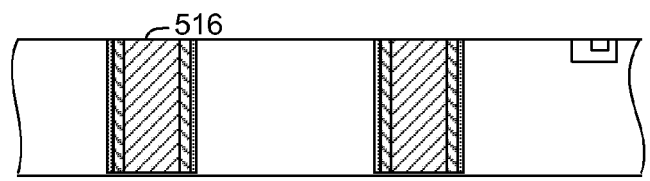
FIG. 5C is a cross section of the partially fabricated interposer of FIG. 5B with a second metal substantially filling the TSV holes.

FIG. 5C is a cross section of the partially fabricated interposer of FIG. 5B with a second metal 516 substantially filling the TSV holes. In a particular embodiment, the second metal is indium that is applied in a molten state in silver-lined TSVs and cooled to a solid state. In another embodiment, the second metal is tin that is applied in a molten state in copper-lined TSVs and cooled to a solid state.

Figure 5D:
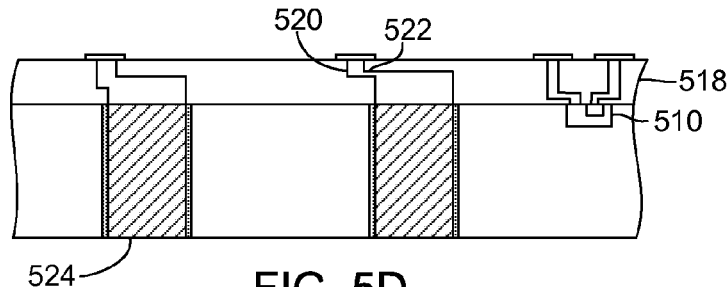
FIG. 5D is a cross section of the partially fabricated interposer of FIG. 5C with a BEOL stack.

FIG. 5D is a cross section of the partially fabricated interposer of FIG. 5C with a BEOL stack 518 having vias 520 and traces 522 that provide electrical connections to the interdiffused TSV 524 and the electronic device 510. Note that the first metal 514 of FIG. 5B has combined (interdiffused) with the second metal 516 of FIG. 5C to form the interdiffusion conductor of the interdiffused TSV 524. In a particular embodiment, the thermal content (basically the time-temperature product) of the processes used to form the BEOL stack 518 is sufficient to anneal the two-metal system of the TSV to form the interdiffusion conductor. In an alternative embodiment, an interdiffusion anneal is performed separately or in addition to the thermal processing of the BEOL stack.

Figure 6:
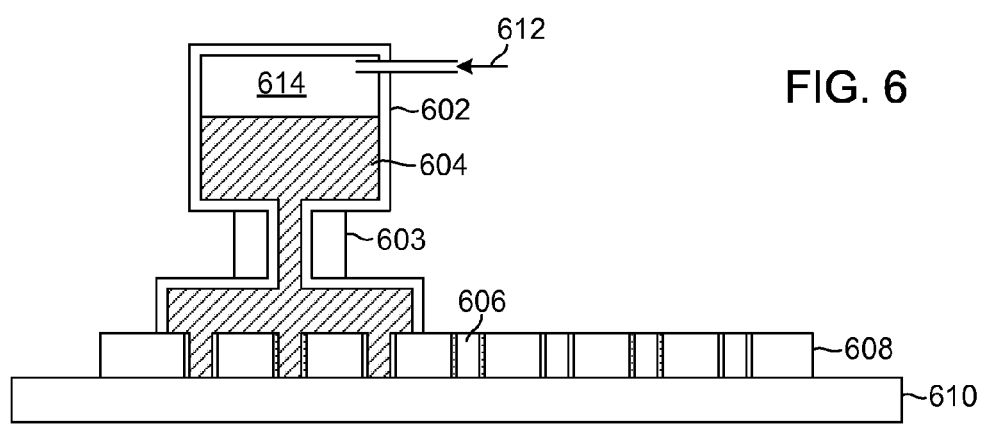
FIG. 6 is a diagram of an apparatus for metal system injection into vias according to an embodiment.

FIG. 6 is a diagram of an apparatus 600 for metal system injection into vias, according to an embodiment. FIG. 6 is not drawn to scale. A dispensing head 602 has a heater 603 and heated metal system precursor 604 that is dispensed into lined vias 606 formed in an interposer wafer 608. The interposer wafer 608 is mounted on a platen or backing plate or backing wafer 610. In a particular embodiment, the interposer wafer 608 is mounted on a vacuum chuck, and the vacuum helps draw heated fluid metal system precursor into the vias. Alternatively, pressure (e.g., nitrogen, reducing gas, or air) 612 pressurizes the precursor reservoir 614 in the dispensing head to assist in via fill. The precursor has a relatively low melting or melt-plus-solid (i.e., multi-phase paste) temperature, generally around the temperatures used in standard soldering processes. When the heated head is moved across the wafer to fill additional vias, the metal system precursor cools into a solid phase(s). After filling the vias with metal system precursor, the wafer is annealed to transform the solid precursor(s) into interdiffusion conductive elements. In a particular embodiment, the molten precursor is a molten metal, such as tin or indium, that is injected into TSVs holes containing a complementary metal for forming an interdiffused conductor. In an alternative embodiment, the precursor is a multi-metal system.

Figure 7:
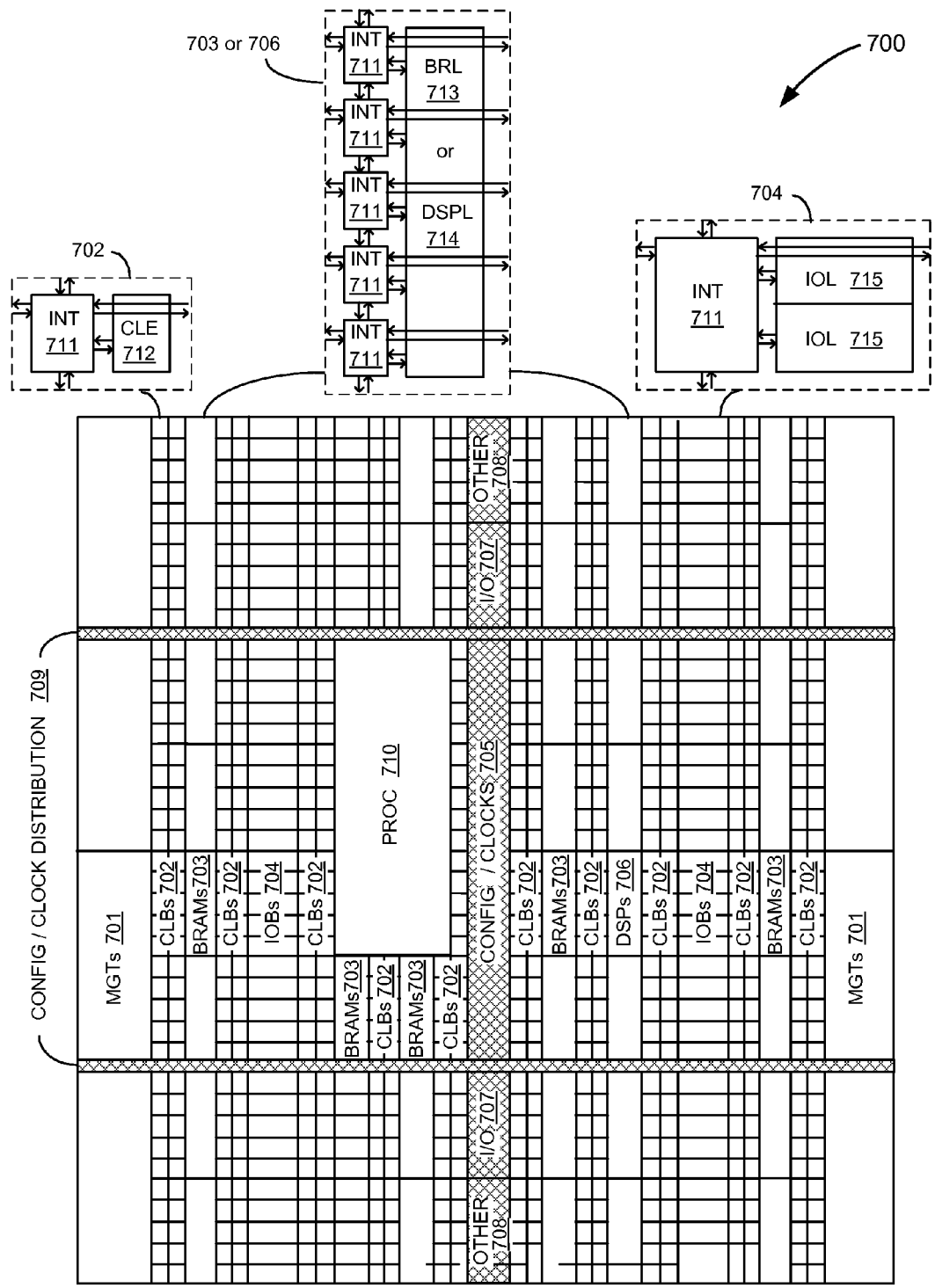
FIG. 7 is a plan view of an FPGA die suitable for use with the described embodiments.

FIG. 7 is a plan view of an FPGA die suitable for use with the embodiments described herein. The FPGA is fabricated using a CMOS fabrication process or mixed CMOS/NMOS process. The FPGA die includes a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing (DSP) blocks 706, specialized input/output blocks (I/O) 707 (e.g., configuration ports and clock ports), and other programmable logic 708 such as digital clock managers, analog-to-digital converters, system monitoring logic, and so forth. Some FPGAs also include dedicated processor blocks (PROC) 710. Horizontal areas 709 extending from the CONFIG/CLOCKS 705 column are used to distribute the clocks and configuration signals across the breadth of the FPGA 700.

In some FPGAs, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA. The programmable interconnect element (INT) 711 also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT) 711. A BRAM 703 can include a BRAM logic element (BRL) 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element (INT) 711. Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs. PROC 710 may comprise a single power domain or it may comprise multiple power domains or it may share a power domain with other blocks in FPGA 700.

Note that FIG. 7 is intended to illustrate only an exemplary FPGA die. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA die more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art in view of the disclosure herein. For example, alternative metal systems or processing steps could be performed to provide interdiffused TSVs having a relatively high re-melt temperature. Therefore, the spirit and scope of the appended claims should not be limited to the foregoing description.

Trademarks are the property of their respective owners.

What is claimed is:

1. A composite integrated circuit (IC), comprising:
   an interposer having a silicon wafer portion and a plurality of interdiffused conductive elements extending through the silicon wafer portion, each of the interdiffused conductive elements having a re-melt temperature of at least 450 degrees Celsius;
   a first integrated circuit die mounted on the interposer; and
   a second integrated circuit die mounted on the interposer.

2. The composite IC of claim 1, wherein the interdiffused conductive elements have an interdiffusion formation temperature less than 400 degrees Celsius.

3. The composite IC of claim 1, wherein the interdiffused conductive elements comprise indium and silver.

4. The composite IC of claim 3, wherein the indium comprises between 40 weight percent and 60 weight percent.

5. The composite IC of claim 1, wherein the interdiffused conductive elements comprise copper and tin.

6. The composite IC of claim 5, wherein the copper comprises at least 10 weight percent.

7. The composite IC of claim 1, wherein the interposer comprises at least one patterned metal layer disposed between a first surface of the silicon wafer portion and the first integrated circuit die.

8. The composite IC of claim 7, wherein the first integrated circuit die is a field-programmable gate array die.

9. The composite IC of claim 7, wherein the second integrated circuit die is an application-specific integrated circuit die or a memory die.

10. The composite IC of claim 7, wherein the second integrated circuit die is a field-programmable gate array die.

11. The composite IC of claim 1, wherein the first integrated circuit die is mechanically and electrically connected to the interposer with a conductive contact array having a melting temperature less than the re-melt temperature.

12. The composite IC of claim 11, wherein the conductive contact array is a solder contact array, the solder having a melting temperature less than 300 degree Celsius.

13. The composite IC of claim 1, wherein the silicon wafer portion of the interposer includes an electronic device formed in the silicon wafer portion.

14. An interposer, comprising:
   a silicon wafer portion;
   a plurality of patterned metal layers disposed on the silicon wafer portion; and
   a plurality of through-silicon vias, each through-silicon via having an interdiffused conductive element that extends through the silicon wafer portion.

15. The interposer of claim 14, wherein the silicon wafer portion includes an electronic device formed in the silicon wafer portion.

* * * * *